(12) United States Patent
Burns et al.

(10) Patent No.: US 7,914,975 B2
(45) Date of Patent: Mar. 29, 2011

(54) MULTIPLE EXPOSURE LITHOGRAPHY METHOD INCORPORATING INTERMEDIATE LAYER PATTERNING

(75) Inventors: Sean D. Burns, Hopewell Junction, NY (US); Allen H. Gabor, Katonah, NY (US); Scott D. Halle, Hopewell Junction, NY (US); Dirk Pfeiffer, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 1022 days.

(21) Appl. No.: 11/733,412

(22) Filed: Apr. 10, 2007

(65) Prior Publication Data

US 2008/0254633 A1    Oct. 16, 2008

(51) Int. Cl.
*G03F 7/26* (2006.01)
(52) U.S. Cl. .................... 430/313; 430/394
(58) Field of Classification Search .......... 430/313, 430/330, 328, 394, 311
See application file for complete search history.

(56) References Cited

U.S. PATENT DOCUMENTS

| | | | |
|---|---|---|---|
| 5,370,969 A | 12/1994 | Vidusek | |
| 5,716,758 A * | 2/1998 | Bae et al. ............. | 430/312 |
| 6,136,511 A | 10/2000 | Reinberg et al. | |
| 6,915,505 B2 | 7/2005 | Hsu et al. | |
| 7,013,439 B2 | 3/2006 | Robles et al. | |
| 7,312,158 B2 * | 12/2007 | Miyagawa et al. ........ | 438/737 |
| 2004/0229158 A1 | 11/2004 | Meador et al. | |

FOREIGN PATENT DOCUMENTS

| | | | |
|---|---|---|---|
| JP | 4338630 A | 11/1992 |
| JP | 5283375 A | 10/1993 |
| JP | 181688 A | 7/1995 |
| JP | 183194 A | 7/1995 |
| JP | 2004094029 A | 3/2004 |
| JP | 2006126301 A | 5/2006 |

OTHER PUBLICATIONS

D.C. Owe-Yang et al.; "Double Exposure for the Contact Layer of the 65-nm Node;" Presented at SPIE Conference, San Jose, CA Mar. 1, 2005.

* cited by examiner

*Primary Examiner* — Kathleen Duda
*Assistant Examiner* — Caleen O Sullivan
(74) *Attorney, Agent, or Firm* — Cantor Colburn LLP; Yuanmin Cai

(57) ABSTRACT

A method of patterning a semiconductor substrate includes creating a first set of patterned features in a first inorganic layer; creating a second set of patterned features in one of the first inorganic layer and a second inorganic layer; and transferring, into an organic underlayer, both the first and second sets of patterned features, wherein the first and second sets of patterned features are combined into a composite set of patterned features that are transferable into the substrate by using the organic underlayer as a mask.

16 Claims, 15 Drawing Sheets

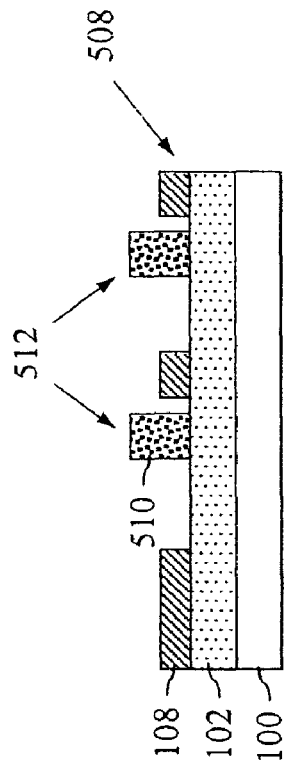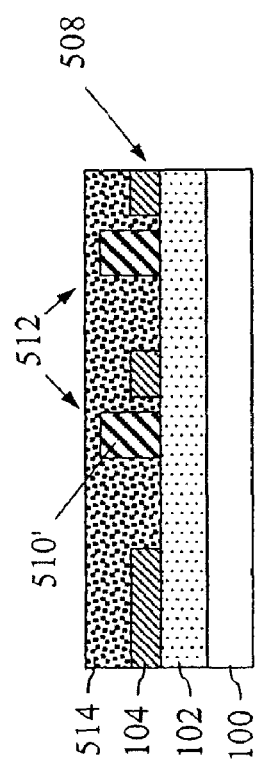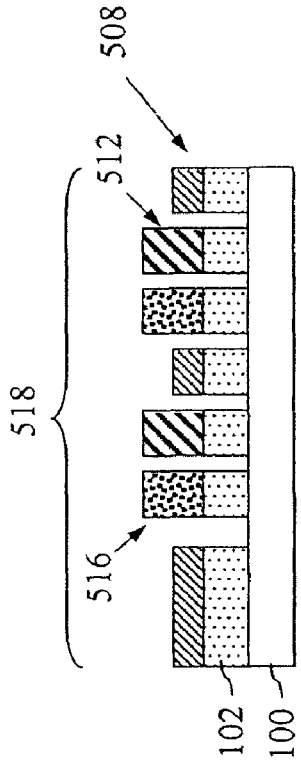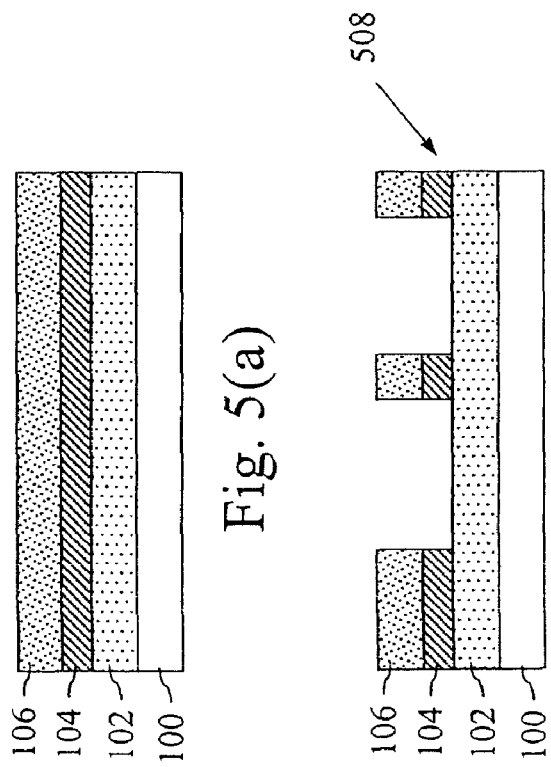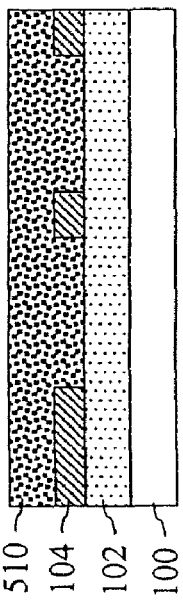

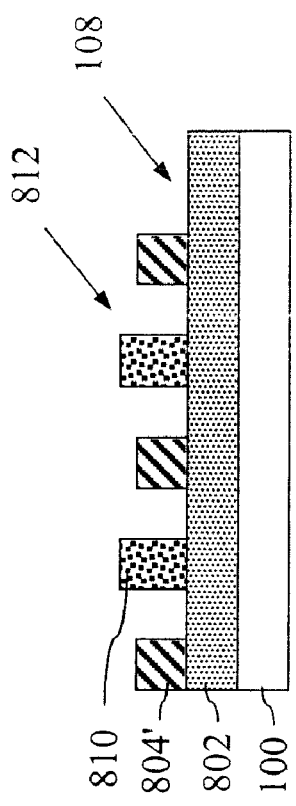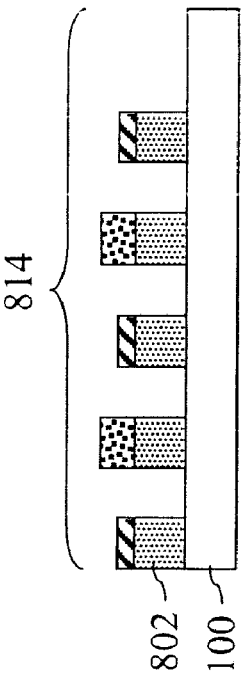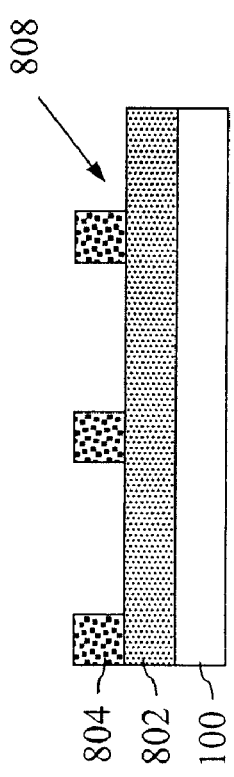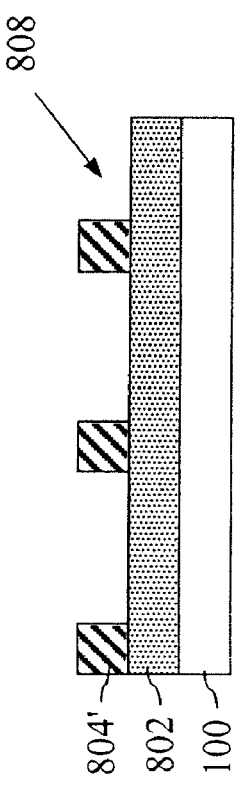
Fig. 8(a) Fig. 8(b) Fig. 8(c) Fig. 8(d) Fig. 8(e) Fig. 8(f)

MULTIPLE EXPOSURE LITHOGRAPHY METHOD INCORPORATING INTERMEDIATE LAYER PATTERNING

BACKGROUND

The present invention relates generally to semiconductor device processing techniques and, more particularly, to semiconductor device resolution enhancement through a multiple exposure lithography method incorporating intermediate layer patterning.

Lithography is one of the most important techniques utilized in semiconductor manufacturing, and is particularly used to define patterns, such as those employed in a wiring layer patterning process or a doped-region defining process for example. A lithography process generally includes an exposure step and a development step, wherein the exposure step utilizes a light source to irradiate a photoresist layer directly or through a photomask to induce chemical reactions in exposed portions. The development step is conducted to remove the exposed portion in positive resist (or the unexposed portion in negative resist) and form photoresist patterns, thus completing the transfer of photomask patterns or virtual patterns to the resist material.

With lithography pushing to the theoretical limits of resolution the use of double exposure is beginning to play a more important role. Techniques such as dipole decomposition can allow the lithographer to print features that would not be possible with a single exposure. Many of these techniques require an intermediate etch step into a hard mask material. However, the hardmask materials can have integration issues because they can interact with the substrate underneath. In addition, because the hardmask is deposited directly on the substrate, the intermediate etches can cause damage to the substrate itself. Opening the hardmask can also expose the substrate to chemicals and/or materials that adversely affect the substrate.

Accordingly, it would be desirable to be able to enhance the resolution of lithographically patterned features in a manner that does not adversely affect the substrate.

SUMMARY

The foregoing discussed drawbacks and deficiencies of the prior art are overcome or alleviated, in an exemplary embodiment by a method of patterning a semiconductor substrate, including creating a first set of patterned features in a first inorganic layer; creating a second set of patterned features in one of the first inorganic layer and a second inorganic layer; and transferring, into an organic underlayer, both the first and second sets of patterned features, wherein the first and second sets of patterned features are combined into a composite set of patterned features that are transferable into the substrate by using the organic underlayer as a mask.

In another embodiment, a method of enhancing photolithography resolution for patterning a semiconductor device includes forming an organic underlayer on a semiconductor substrate; forming a silicon containing intermediate layer on the organic layer; forming a first organic resist layer on the intermediate layer; exposing and developing the first organic resist layer so as to form a first set of patterned features on top of the silicon containing intermediate layer; etching the intermediate layer so as to form a first pattern therein; coating, exposing and developing a second resist layer so as to form a second set of patterned features, wherein the first and second sets of patterned features define a composite set of patterned features; and etching the composite set of patterned features into the organic underlayer.

In still another embodiment, a method of enhancing photolithography resolution for patterning a semiconductor device includes forming an organic underlayer on a semiconductor substrate; forming a first silicon containing resist layer on the organic layer; exposing and developing the first silicon containing resist layer so as to form a first set of patterned features therein; cross-linking the first set of patterned features; forming a second silicon containing resist layer over the first set of patterned features; exposing and developing the second silicon containing resist layer so as to form a second set of patterned features therein, wherein the first and second sets of patterned features define a composite set of patterned features; and etching the composite set of patterned features into the organic underlayer.

BRIEF DESCRIPTION OF THE DRAWINGS

Referring to the exemplary drawings wherein like elements are numbered alike in the several Figures:

FIGS. 5(a) through 5(f) are a sequence of cross sectional views of a fifth embodiment of a multiple exposure lithography method incorporating intermediate layer patterning;

FIGS. 8(a) through 8(f) are a sequence of cross sectional views of an eighth embodiment of a multiple exposure lithography method incorporating intermediate layer patterning.

DETAILED DESCRIPTION

Figure 1A:
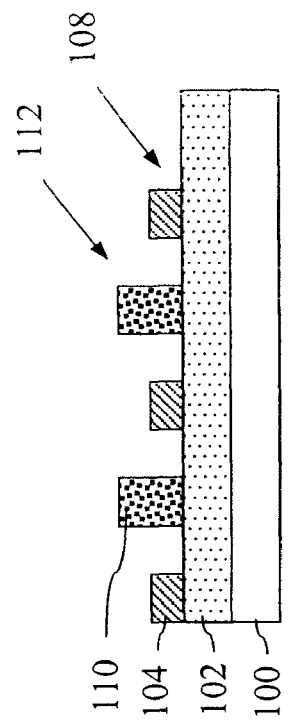
FIGS. 1(a) through 1(e) are a sequence of cross sectional views of a first embodiment of a multiple exposure lithography method incorporating intermediate layer patterning.

Disclosed herein are various embodiments of implementing a multiple exposure lithography method that incorporates intermediate layer patterning. Briefly stated, a first set of patterned features is defined in an inorganic (e.g., silicon containing) material through a first exposure. The inorganic material may be, for example, a silicon containing intermediate layer patterned through a process flow comprising photoresist exposure and development followed by etch or, alternatively, a developed layer of silicon containing resist material that is subsequently cross-linked. Thereafter, at least one other set of patterned features is created through at least a second exposure so as to result in a composite set of patterned features, which are then transferred into an organic underlayer formed directly upon a semiconductor substrate to be patterned. The organic underlayer, having the composite pattern defined therein, may then be used as a hardmask to transfer the composite pattern to the substrate.

As used herein, the term "substrate" may refer to any level of semiconductor device (e.g., active area, dielectric/insulating layer, etc.) subject to further processing and feature patterning. An "organic underlayer" is a material that is spin coated onto a substrate, the underlayer having an exemplary a thickness of about 100 nanometers (nm) to about 1000 nm, with index of refraction (n) and absorption constant (k) values optimized to minimize reflectivity. The reflectivity may either be minimized with the organic underlayer alone in the case of bilayer resist, or together with an inorganic intermediate layer in the case of a trilayer resist system. An organic underlayer includes elements such as C, H, O and N, and is cross-linkable so that it does not intermix with subsequently spin coated materials. In addition, the organic underlayer is designed to have selectivity relative to inorganic materials such as silicon-containing resist or inorganic intermediate layers (as well as having good etch selectivity relative to the substrate).

An "inorganic intermediate layer" generally refers to a material that is spin coated on top of an organic underlayer in a trilayer resist scheme. In exemplary embodiments presented herein, the inorganic intermediate layer is silicon-containing, and cross-linkable so that it does not intermix with subsequently spin coated materials. The inorganic layer is designed to have good etch selectivity relative to the organic underlayer. Exemplary thicknesses of about 30 nanometers (nm) to about 200 nm are used for the inorganic intermediate layer, with index of refraction (n) and absorption constant (k) values optimized to minimize reflectivity, usually in combination with an organic underlayer. While a silicon containing, spin coatable material is described above for the inorganic intermediate layer, there are many other suitable materials contemplated herein. For example, CVD, SiO2 or TiO2 can be used. In addition, germanium or titanium containing spin coatable materials may be used.

As also used herein, the term "patterning" may refer to any process step or process steps that creates features on a substrate. The patterning step can be accomplished by exposure through a photomask with subsequent development. The patterning step can also refer to transferring a pattern that has been developed in a resist film and then transferred into an underlying material using reactive ion etch (RIE) or other transfer techniques. In addition, patterning can refer to process steps that sequentially have an exposure, development and RIE. Finally, although the patterning techniques described herein generally refer to an exposure, other techniques may also be used, such as imprint lithography for example.

Referring initially to FIGS. 1(a) through 1(e), there is shown a sequence of cross sectional views of a first embodiment of a multiple exposure lithography method incorporating intermediate layer patterning. For ease and convenience of description, similar layers/components/elements common to several embodiments are designated with like reference numerals, and duplicative description of common processing steps is omitted. As particularly shown in FIG. 1(a), a semiconductor substrate 100 has an organic underlayer 102 formed thereupon. Again, substrate 100 may represent any level of semiconductor device (e.g., active area, dielectric/insulating layer, etc.) subject to further processing and feature patterning, while the organic underlayer 102 is a spin coated, cross-linkable material having etch selectivity with respect to inorganic layers and the substrate 100. In addition, a silicon containing, inorganic intermediate layer 104 is coated upon the organic underlayer 102, followed by a coating of organic resist material 106. It will be noted at this point that the lithography techniques presented herein may be implemented with positive or negative tone resists (as well with other lithography techniques such as imprint, EUV or other next generation lithography processes).

Figure 1B:
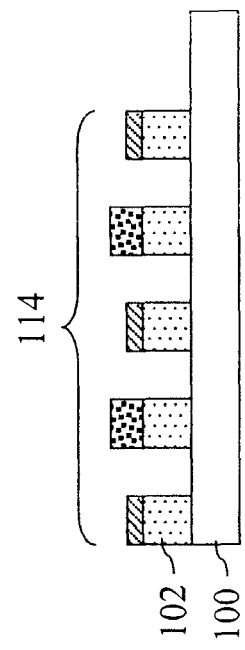
Figure 1C:
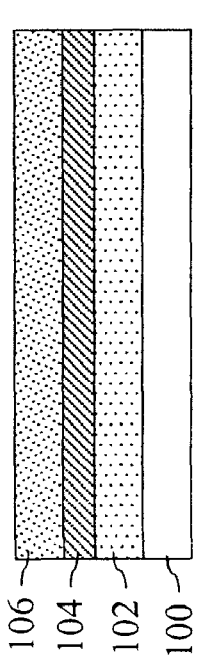
Figure 1D:
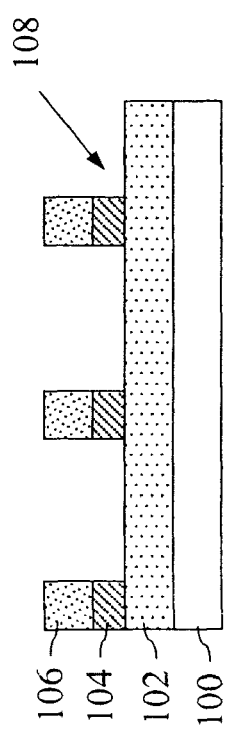

Following a first exposure and development step of the organic resist layer 106, a first set of patterned features 108 is defined by etching into the inorganic intermediate layer 104, as shown in FIG. 1(b). Then, following removal of the organic resist, typically through a solvent strip, the patterned inorganic intermediate layer 104 and exposed portions of the organic underlayer 102 are coated with a silicon containing resist layer 110, as shown in FIG. 1(c). Again, the silicon containing resist layer 110 may be a positive or negative tone resist material. Also, the silicon containing resist later could be replaced by a germanium or titanium containing resist. As then shown in FIG. 1(d), a second exposure is used to create a second set of patterned features 112, after the silicon containing resist layer 110 is developed. In the particular embodiment depicted, the second set of features is created within the silicon containing resist layer 110. Together, the first set of patterned features 108 (formed in the inorganic intermediate layer 104) and the second set of patterned features 112 (formed in the silicon containing resist layer 110) combine to form a composite set of patterned features.

Figure 1E:
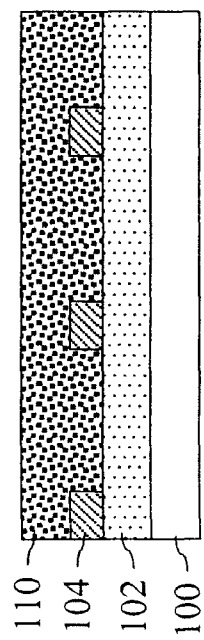

As depicted in FIG. 1(e), the composite set of features 114 is transferred into the organic underlayer 102. This may be accomplished with a single etch, as the organic etching material will be selective with respect to the silicon containing intermediate layer 104 and silicon containing resist layer 110. The first embodiment of FIGS. 1(a) through 1(e) may thus be characterized as a double exposure process. Where both exposures are through a bright field (BF) mask, the composite pattern 114 may represent a small feature capable of being patterned at a tighter pitch with respect to a single exposure (but without the drawbacks of using a conventional intermediate hardmask).

Figure 2A:
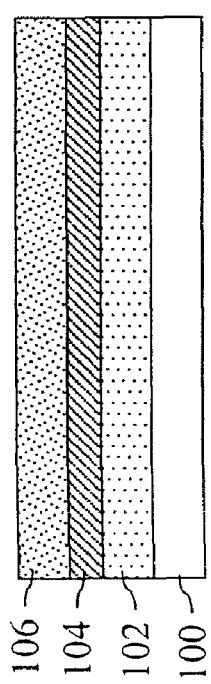
FIGS. 2(a) through 2(o) are a sequence of cross sectional and top views of a second embodiment of a multiple exposure lithography method incorporating intermediate layer patterning.
Figure 2C:
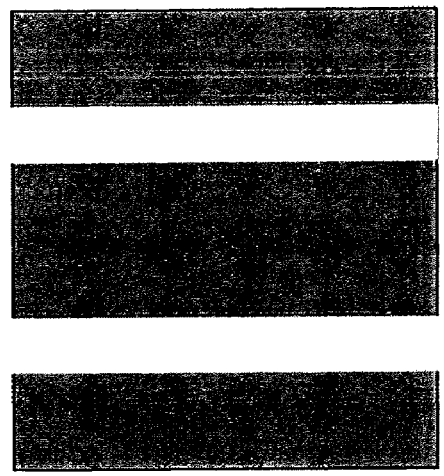
Figure 2B:
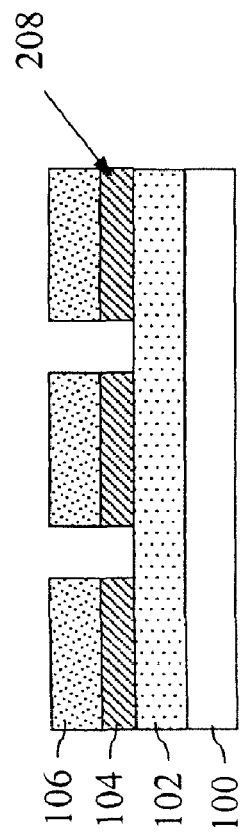

Referring next to FIGS. 2(a) through 2(f), there is shown a sequence of cross sectional views of a second embodiment of a multiple exposure lithography method incorporating intermediate layer development. As in the first embodiment, FIG. 2(a) illustrates a tri-layer stack (organic underlayer 102, inorganic intermediate layer 104, and organic resist material 106) formed upon the substrate 100. In FIG. 2(b), a first set of patterned features 208 is formed in the inorganic intermediate layer 104 through a first exposure and develop of the organic resist material 106 followed by etch transfer into the inorganic intermediate layer. In the example illustrated, the first set of patterned features 208 may be formed through a dark field (DF) mask, wherein much of the organic resist layer 106 remains after the first exposure and development thereof.

Figure 2D:
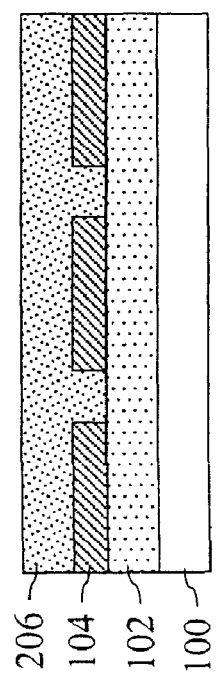

One specific type of patterning that may be carried out through this embodiment is pitch splitting of trenches, as reflected in FIG. 2(c), which is a top view of the first set of patterned features defined in the organic resist layer 106 (and inorganic intermediate layer 104) in FIG. 2(b). However, in contrast to the first embodiment, the patterned inorganic intermediate layer 104 and exposed portions of the organic underlayer 102 are coated with another organic resist layer 206, as shown in FIG. 2(d).

Figure 2F:
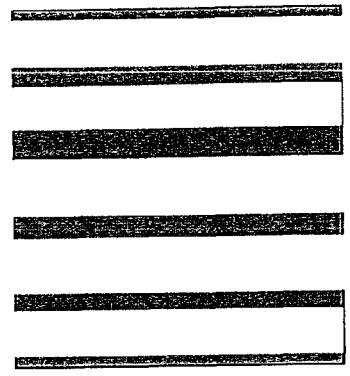
Figure 2H:
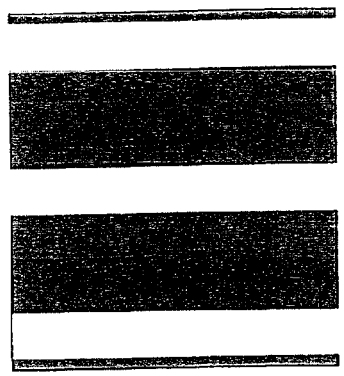
Figure 2E:
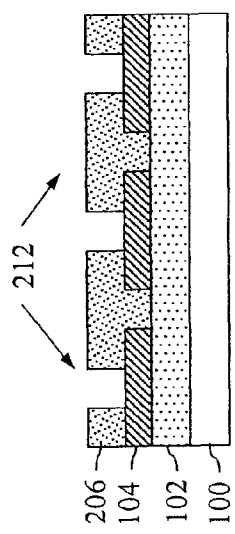
Figure 2G:
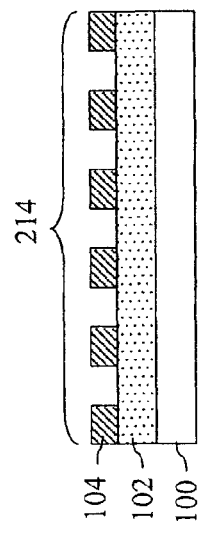
Figure 2I:
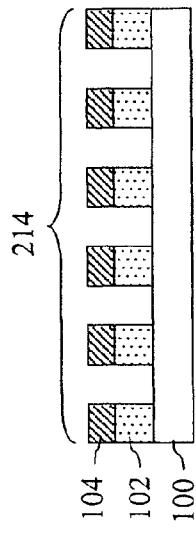

Then, as shown in FIG. 2(e), a second set of patterned features 212 is defined through a second exposure and develop of the organic resist material 206. In the example illustrated, the second set of patterned features 212 may also be formed through a DF mask, wherein much of the organic resist layer 206 remains after the second exposure and development thereof. Whereas the second set of patterned features in the first embodiment is formed in a silicon containing resist layer, both the first and second sets of patterned features of the second embodiment are formed in the inorganic intermediate layer 104. A top view of the second set of patterned features defined in the organic resist layer 206 is shown in FIG. 2(f). The resulting composite pattern 214 is formed in the inorganic intermediate layer 104 as shown in FIG. 2(g) and the top view of FIG. 2(h), and thereafter transferred into the organic underlayer 102 in FIG. 2(i).

Figure 2M:
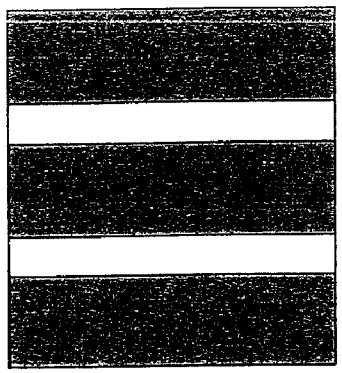
Figure 2N:
Figure 2O:
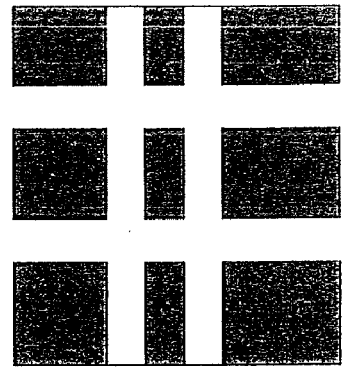
Figure 2J:
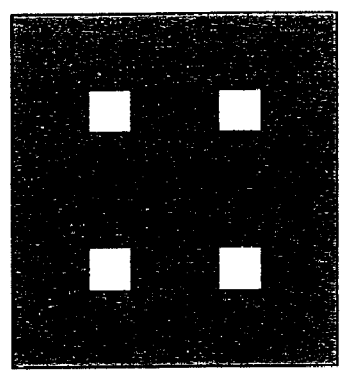
Figure 2K:
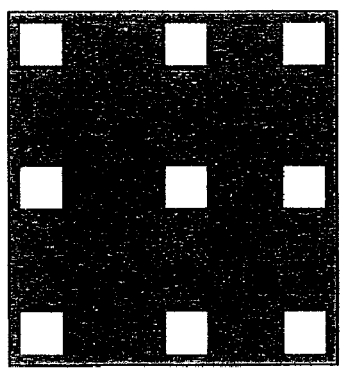
Figure 2L:
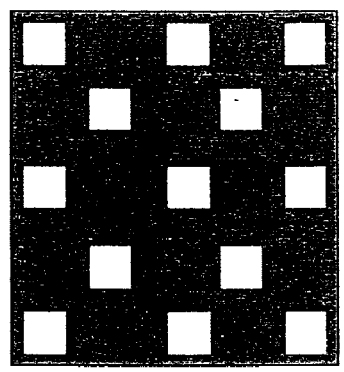

The second embodiment of FIGS. 2(a) through 2(i) may be used, for example, where there are two different exposures used to print a metal level or contact area/via level. In the metal level case, the two exposures could interact with one another (i.e., some "exposed" regions could be exposed twice). By way of additional example, FIGS. 2(j), 2(k) and 2(l) are a sequence of top view illustrating first, second, and composite patterns of via pitch splitting, analogous to the trench pitch splitting sequence of FIGS. 2(c), 2(f) and 2(h). Still another patterning example of the second embodiment is depicted in the top views of FIGS. 2(m), 2(n) and 2(o), in which the patterning sequence illustrates an example of X-Y decomposition of trenches. That is, the formed trench patterns interact with one another to form the composite trench pattern shown in FIG. 2(o).

Figure 3C:
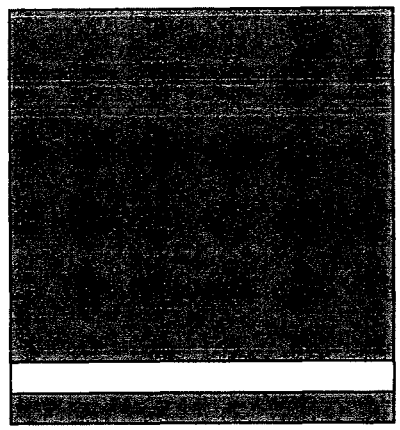
FIGS. 3(a) through 3(l) are a sequence of cross sectional and top views of a third embodiment of a multiple exposure lithography method incorporating intermediate layer patterning.
Figure 3A:
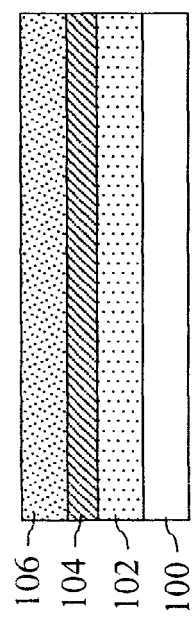
Figure 3B:
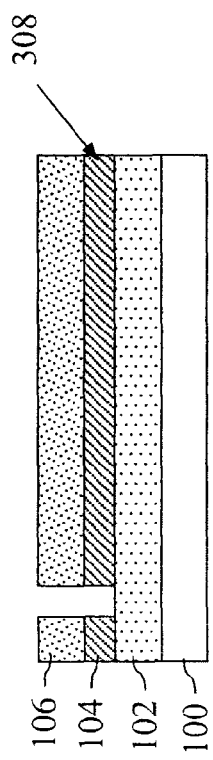
Figure 3D:
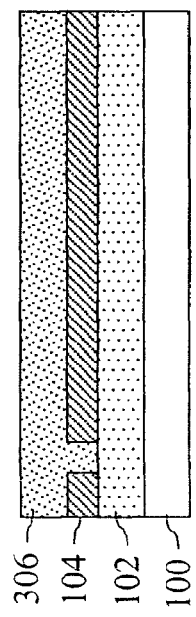

FIGS. 3(a) through 3(f) illustrate a sequence of cross sectional views of a third embodiment of a multiple exposure lithography method incorporating intermediate layer development. This embodiment is similar to the second embodiment (i.e., creation of a first set of patterned features 308 in the inorganic intermediate layer 104 through a first exposure and develop of the organic resist material 106 followed by etch transfer into the inorganic intermediate layer, as shown in FIGS. 3(a) and 3(b)). In the example illustrated, the first set of patterned features 308 may be formed through a DF mask, a top view of which is shown in FIG. 3(c). As in the case of the second embodiment, the patterned inorganic intermediate layer 104 and exposed portions of the organic underlayer 102 are then coated with another organic resist layer 306, as shown in FIG. 3(d).

Figure 3F:
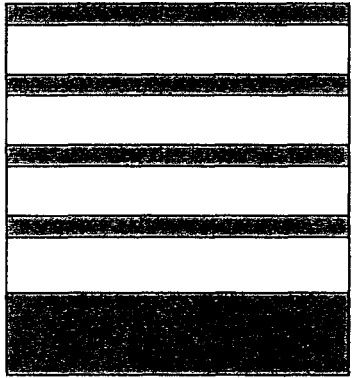
Figure 3H:
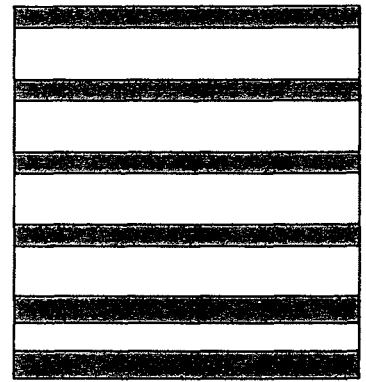
Figure 3E:
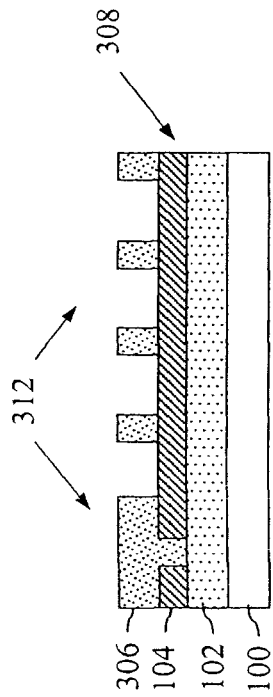
Figure 3G:
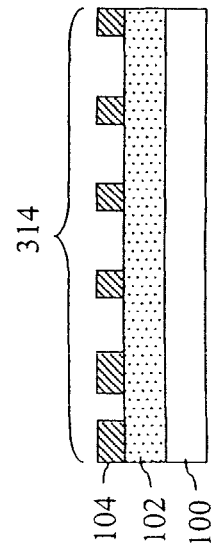
Figure 3I:
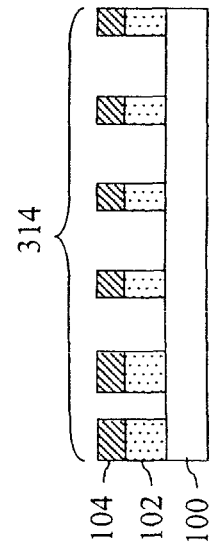

In FIG. 3(e), a second set of patterned features 312 is defined through a second exposure and develop of the organic resist material 306. FIG. 3(f) is a top view of the second set of patterned features 312 of FIG. 3(e). In the example illustrated, the second set of patterned features 312 is formed through a BF mask, which also blocks (protects) at least a portion of the features created by the first exposure. As illustrated in FIG. 3(g) and the top view of FIG. 3(h), the resulting composite pattern 314 is formed in the inorganic intermediate layer 104, and in FIG. 3(i), the composite pattern 314 is transferred into the organic underlayer 102. One suitable application of the third embodiment is patterning of transistor gate structures, wherein a bright field prints lines and a dark field prints spaces that define line ends.

Figure 3J:
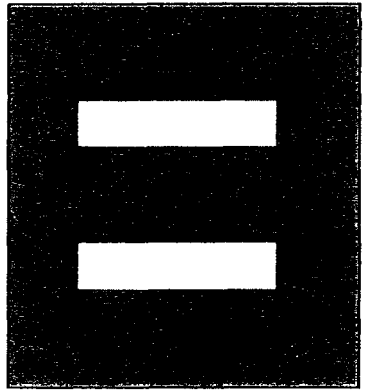
Figure 3K:
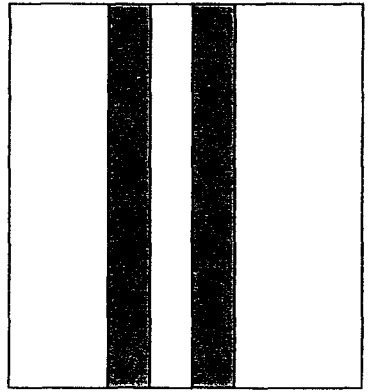
Figure 3L:
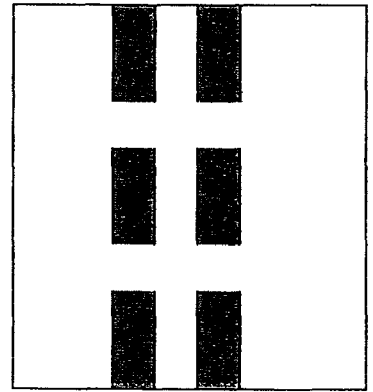

Whereas the exemplary patterning arrangement of the third embodiment of FIGS. 3(a) through 3(i) represents a minimum space and minimum line splitting technique, still another patterning example of the third embodiment is depicted in the top views of FIGS. 3(j), 3(k) and 3(l), in which the patterning sequence therein line and line-end-space decomposition.

Figure 4A:
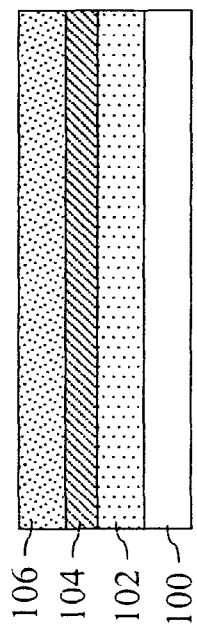
FIGS. 4(a) through 4(l) are a sequence of cross sectional and top views of a fourth embodiment of a multiple exposure lithography method incorporating intermediate layer patterning.
Figure 4B:
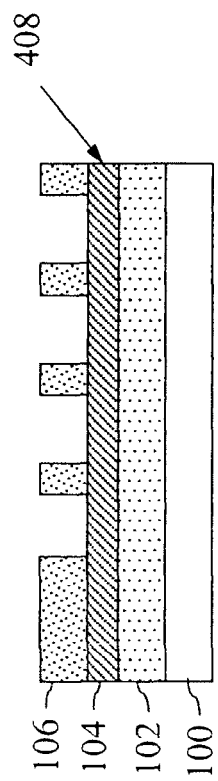
Figure 4C:
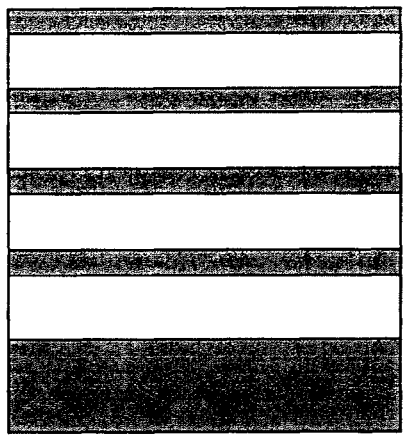
Figure 4D:
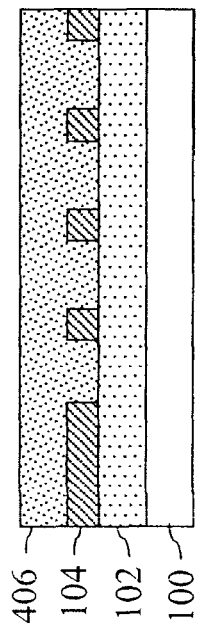

FIGS. 4(a) through 4(f) illustrate a sequence of cross sectional views of a fourth embodiment of a multiple exposure lithography method incorporating intermediate layer development. This embodiment is similar to the third embodiment, but reversing the order of BF/DF masks in the double exposure. As in FIGS. 4(a) and 4(b), a first set of patterned features 408 is created in the inorganic intermediate layer 104 through a first exposure and develop of the organic resist material 106 followed by etch transfer into the inorganic intermediate layer. In this embodiment, the first exposure is implemented through a BF mask, a top view of which is shown in FIG. 4(c). The patterned inorganic intermediate layer 104 and exposed portions of the organic underlayer 102 are then coated with another organic resist layer 406, as shown in FIG. 4(d).

Figure 4F:
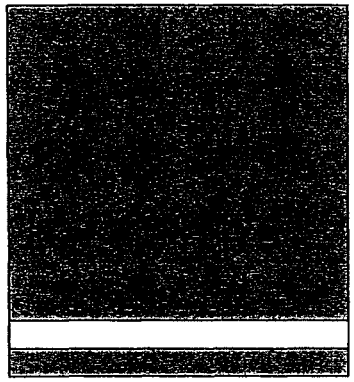
Figure 4H:
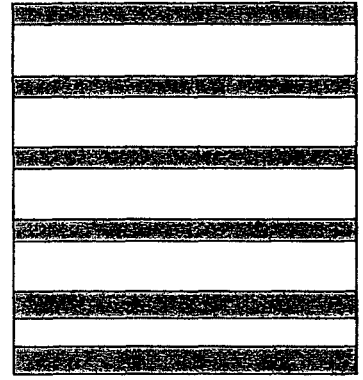
Figure 4E:
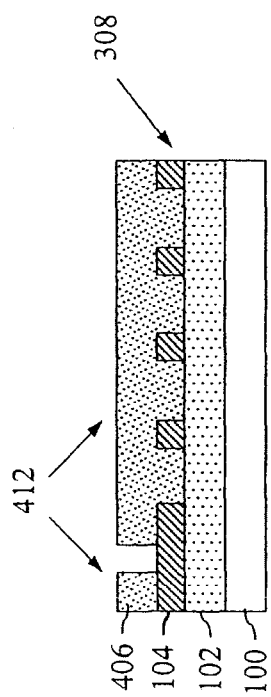
Figure 4G:
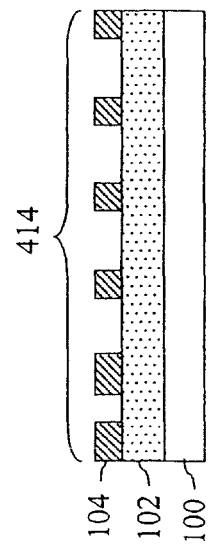
Figure 4I:
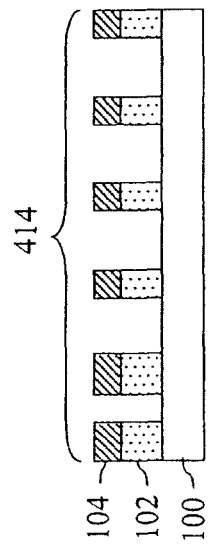

In FIG. 4(e), a second set of patterned features 412 is defined through a second exposure and develop of the organic resist material 406. FIG. 4(f) is a top view of the second set of patterned features 412 of FIG. 4(e). In the embodiment illustrated, the second set of patterned features 412 is formed through a DF mask which also blocks at least a portion of the features created by the first exposure. As illustrated in FIG. 4(g) and the top view of FIG. 4(h), the resulting composite pattern 414 is formed in the inorganic intermediate layer 104, and in FIG. 4(i), the composite pattern 414 is transferred into the organic underlayer 102.

Figure 4J:
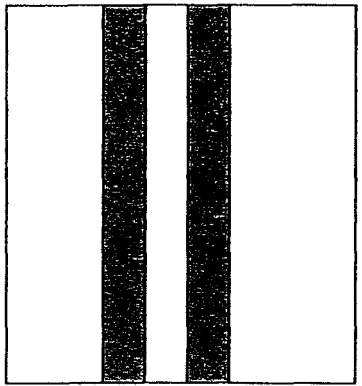
Figure 4K:
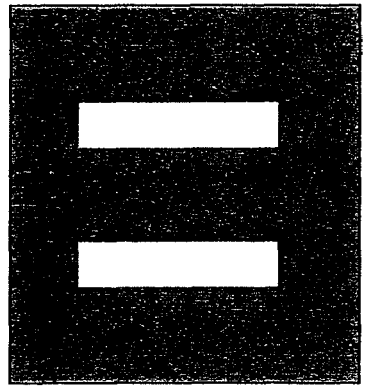
Figure 4L:
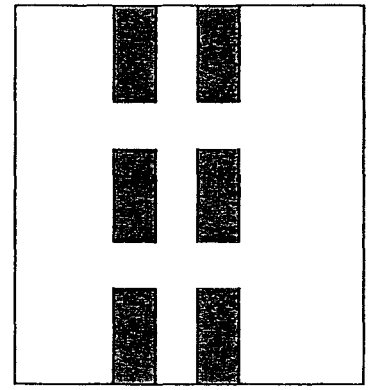

Whereas the exemplary patterning arrangement of the fourth embodiment of FIGS. 4(a) through 4(i) represents a minimum space and minimum line splitting technique, still another patterning example of the third embodiment is depicted in the top views of FIGS. 4(j), 4(k) and 4(l), in which the patterning sequence therein line and line-end-space decomposition.

In addition to the above described, exemplary double exposure embodiments, even further exposures for fine pitch spacing are also contemplated. For example, FIGS. 5(a) through 5(f) are a sequence of cross sectional views of a fifth embodiment of a multiple exposure lithography method incorporating intermediate layer development. This embodiment is similar to the first embodiment, with the addition of a cross-linking step after the second exposure if the silicon containing resist being used is positive tone (a negative tone resist may or may not need additional cross-linking through the bake and cure methods described above), and a third exposure to create a third set of patterned features such that the resulting composite set of features is a combination of a first, second and third set of patterned features.

More specifically, FIGS. 5(a) and 5(b) illustrate a first exposure of the organic resist layer 106, so as to define a first set of patterned features 508 in the inorganic intermediate layer 104. Then, as shown in FIG. 5(c), the patterned inorganic intermediate layer 104 and exposed portions of the organic underlayer 102 are coated with a planarizing silicon containing resist layer 510. As then shown in FIG. 5(d), a second exposure is used to create a second set of patterned features 512, after the silicon containing resist layer 510 is developed. To this point, the fifth embodiment is substantially the same as the first embodiment. However, in preparation of a third exposure, the second set of patterned of features 512 (formed in developed resist layer 510) is then cross-linked, such as by baking, ultraviolet (UV) curing, or a combination of both. The cross-linked resist material is designated as 510' in FIG. 5(e).

As also shown in FIG. 5(e), a second silicon containing resist layer 514 is then formed over the first and second sets of patterned features 508, 512, and over the exposed portions of the organic underlayer 102. Because the remaining patterned portions of the first silicon containing resist layer 510' have been cured, the second set of patterned features 512 will not be lost once the structure has been coated with the second silicon containing resist layer 514. A third exposure is then used to define a third set of patterned features 516 in the second silicon containing resist layer 514, as shown in FIG. 5(f). As each of the first, second and third set of patterned features is defined in a silicon containing material, the composite pattern 518 may then be transferred into the organic underlayer 102 with a single etch step, as further shown in FIG. 5(f).

Referring next to FIGS. 6(a) through 6(j), there is shown a sequence of cross sectional views of a sixth embodiment of a multiple exposure lithography method incorporating intermediate layer development. This embodiment is similar to the second embodiment, with the addition of a third exposure to create a third set of patterned features such that the resulting composite set of features is a combination of a first, second and third set of patterned features.

Figure 6A:
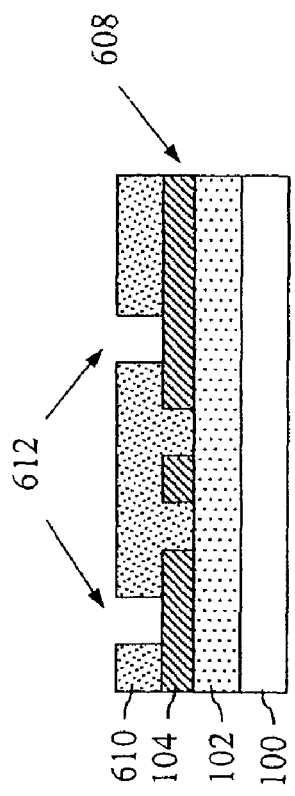
FIGS. 6(a) through 6(j) are a sequence of cross sectional views of a sixth embodiment of a multiple exposure lithography method incorporating intermediate layer patterning.
Figure 6B:
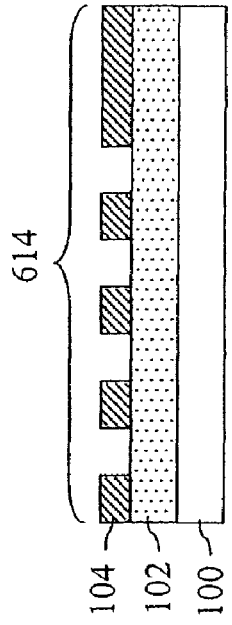
Figure 6C:
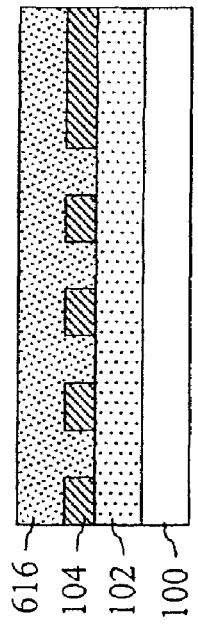
Figure 6D:
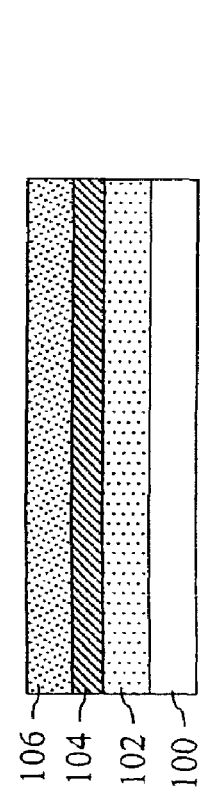

FIGS. 6(a) and 6(b) illustrate a first exposure of the organic resist layer 106, so as to define a first set of patterned features 608 in the inorganic intermediate layer 104. Then, as shown in FIG. 6(c), the patterned inorganic intermediate layer 104 and exposed portions of the organic underlayer 102 are coated with a second organic resist layer 606. In FIG. 2(d), a second set of patterned features 612 is defined through a second exposure and develop of the second organic resist layer 606. Once the second set of patterned features is transferred to the inorganic intermediate layer 104, an "intermediate" composite pattern 614 is formed therein as shown in FIG. 6(e).

Figure 6E:
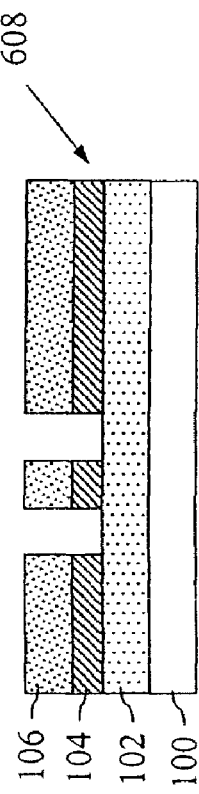
Figure 6F:
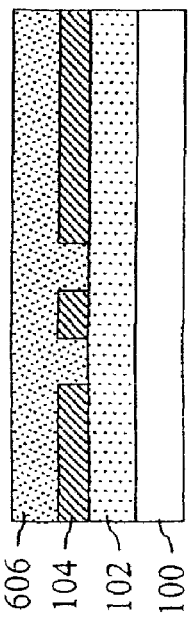
Figure 6G:
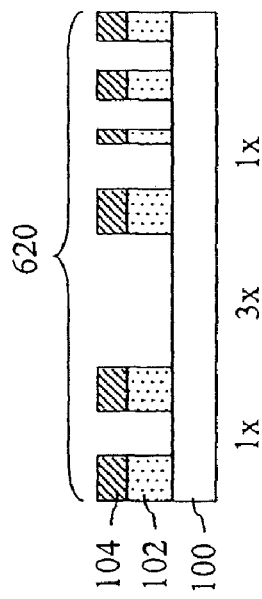
Figure 6J:
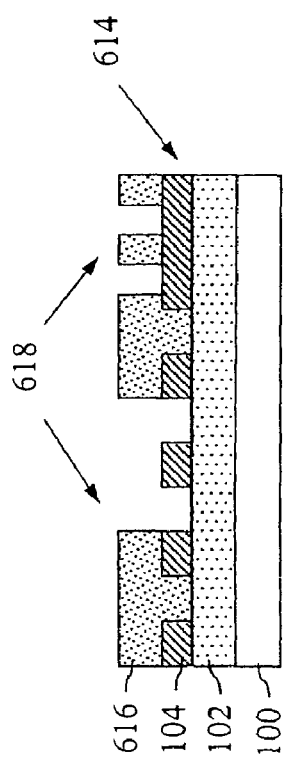
Figure 6H:
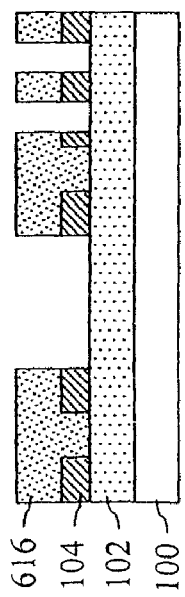
Figure 6I:
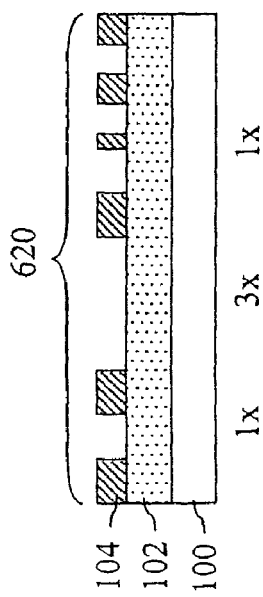

In contrast to the second embodiment, the structure of FIG. 6(e) is then coated with a third organic resist layer 616 as shown in FIG. 6(f). In FIG. 6(g), a third set of patterned features 618 is defined through a third exposure and develop of the third organic resist layer 616. Once the third set of patterned features is transferred to the inorganic intermediate layer 104 as shown in FIG. 6(h), a final composite pattern 620 is formed therein as shown in FIG. 6(i). Then, in FIG. 6O), the composite pattern 620 is transferred into the organic underlayer 102. As particularly shown in FIGS. 6(i) and 6(j), this triple exposure embodiment may be useful for achieving 1X and 3X features in separate exposures for the purpose of (for example) pitch/trench splitting.

Referring now to FIGS. 7(a) through 7(e), there is shown a sequence of cross sectional views of a seventh embodiment of a multiple exposure lithography method incorporating intermediate layer development. The seventh embodiment is a variation of first embodiment, in which the second set of patterned features is used to block a portion of the first set of patterned features in forming the composite set of features.

Figure 7A:
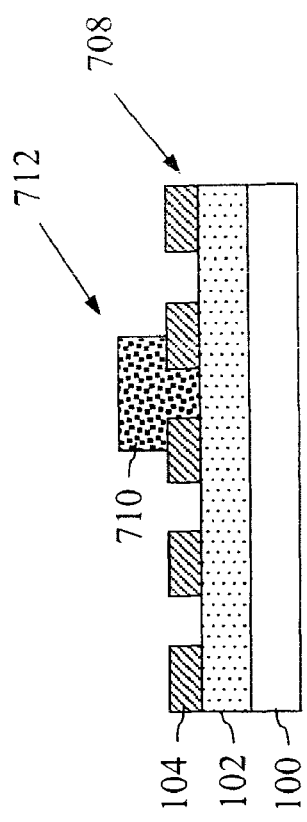
FIGS. 7(a) through 7(e) are a sequence of cross sectional views of a seventh embodiment of a multiple exposure lithography method incorporating intermediate layer patterning.
Figure 7B:
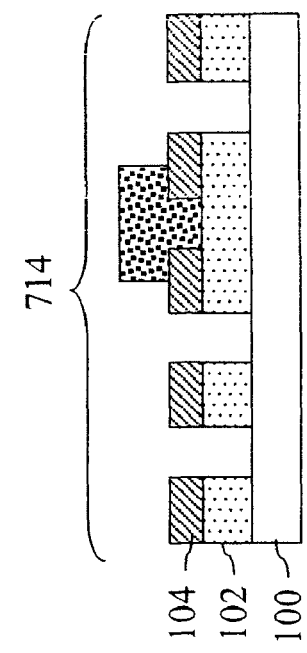
Figure 7C:
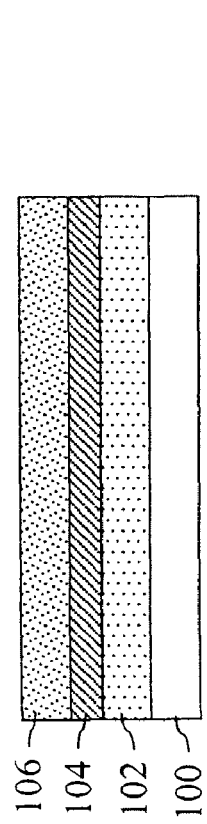
Figure 7D:
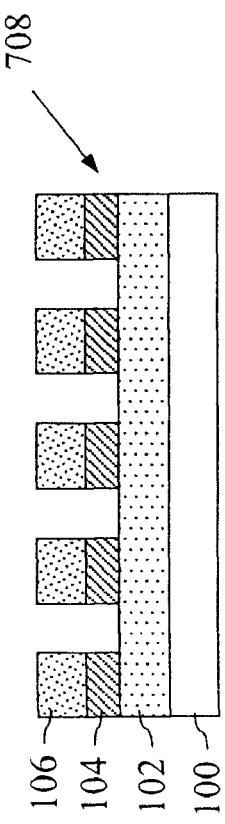
Figure 7E:
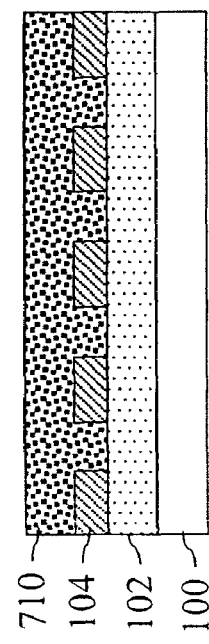

FIGS. 7(a) and 7(b) illustrate a first exposure of the organic resist layer 106, so as to define a first set of patterned features 708 in the inorganic intermediate layer 104. Then, as shown in FIG. 7(c), the patterned inorganic intermediate layer 104 and exposed portions of the organic underlayer 102 are coated with a silicon containing resist layer 710. As then shown in FIG. 7(d), a second exposure is used to create a second set of patterned features 712, after the silicon containing resist layer 710 is developed. In contrast to the first embodiment where the second set of patterned features are "additive" with respect to the first set, the second set of patterned features 712 plug a portion of the first set of patterned features 708, and can be considered "subtractive". The resulting composite pattern 714 is then transferred into the organic underlayer 102 in FIG. 7(d).

Finally, FIGS. 8(a) through 8(f) are a sequence of cross sectional views of an eighth embodiment of a multiple exposure lithography method incorporating intermediate layer development. In each of the previously described embodiments, the first set of patterned features is formed through etching of a developed organic resist pattern into a silicon containing, inorganic intermediate layer 104 coated upon the organic underlayer 102. However, as mentioned above, in lieu of an initial tri-layer stack (i.e., organic underlayer 102, inorganic intermediate layer 104, and organic resist material 106) formed upon the substrate 100, a bi-layer stack could also be used.

As particularly shown in FIG. 8(a), an organic underlayer 802 is formed over a semiconductor substrate 100. Then, a first silicon containing resist layer 804 (e.g., positive or negative tone) is formed directly upon the organic underlayer 802 with antireflective properties. In FIG. 8(b), a first exposure/develop is used to create a first set of patterned features 808 directly in the first silicon containing resist layer 804 itself. In order to preserve the first set of patterned features 808, the patterned first silicon containing resist layer 804 is then cross-linked, such as by baking, ultraviolet (UV) curing, or a combination of both if the silicon containing resist being used is positive tone. A negative tone resist may or may not need additional cross-linking through the bake and cure methods described above. The cross-linked resist material is designated as 804' in FIG. 8(c).

As then shown in FIG. 8(d), a second silicon containing resist layer 810 is formed over the first set of patterned features 808 and the exposed portions of the organic underlayer 802 with antireflective properties. Because the remaining patterned portions of the first silicon containing resist layer 804' have been cured, the first set of patterned features 808 will not be lost once the structure has been coated with the second silicon containing resist layer 810. A second exposure is then used to define a second set of patterned features 812 in the second silicon containing resist layer 810, as shown in FIG. 8(e). As both of the first and second set of patterned features are defined in a silicon containing material, the composite pattern 814 may then be transferred into the organic underlayer 802 with antireflective properties with a single etch step, as shown in FIG. 8(f). It will be appreciated, however, that additional exposures could also be used to pattern subsequent sets of features within the organic underlayer 802 with antireflective properties. In this event, each patterned silicon resist layer would be cross-linked prior to deposition of subsequent resist layers.

As will thus be appreciated, the exemplary embodiments described herein provide a means for enhancing the resolution of lithographically patterned features in a manner that does not adversely affect the underlying substrate. One advantages of the exemplary embodiments is the additive (or subtractive as was described in the seventh embodiment) nature of a double (or more) exposure process. Because the two or more sets of patterned images are effectively combined together, many applications are possible that are not otherwise possible with existing double exposure techniques. Previous applications of multiple exposure techniques require the first photoimaged layer to be insoluble in the spinning solvent of the second photoimaging layer. In contrast, the present embodiments exploit the application of a silicon rich intermediate layer to decouple the patterning of a first image layer from a second image layer. Still another advantage of the present embodiments (with the exception of embodiments 5 and 8) is the elimination of topography problems associated with conventional double exposure methodologies. This is because of the inherently thin nature of the inorganic intermediate layer relative to the spin coated resists.

Because a prior exposure(s) image is recorded in silicon-containing material the substrate is not exposed to the etch chemistry or any other material during the "printing" of the multi-exposure. Thus, several of the described embodiments may be used for exposure to double, tri, quad, etc. exposures, with each exposure allowing the previous exposures to be stored in a silicon-containing intermediate transfer layer.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of patterning a semiconductor substrate, the method comprising:
    creating a first set of patterned features in a first inorganic layer;
    creating a second set of patterned features in one of the first inorganic layer and a second inorganic layer; and
    transferring, into an organic underlayer, both the first and second sets of patterned features, wherein the first and second sets of patterned features are combined into a composite set of patterned features that are transferable into the substrate by using the organic underlayer as a mask;
    wherein the first inorganic layer comprises a silicon containing inorganic intermediate layer initially formed over the organic layer;
    the first set of patterned features is created by patterning the first inorganic intermediate layer using a first organic resist layer formed thereon; and
    wherein the second set of patterned features is formed by exposing and developing a first silicon containing resist layer formed over the first set of patterned features, the first silicon containing resist layer comprising the second inorganic layer.

2. The method of claim 1, wherein the first inorganic resist layer comprises a first silicon containing resist layer.

3. The method of claim 2, further comprising:
    cross-linking the second set of patterned features;
    exposing and developing a second silicon containing resist layer formed over the first and second sets of patterned features so as to create a third set of patterned features; and
    transferring each of the first, second and third sets of patterned features into the organic underlayer, wherein the first, second and third sets of patterned features are combined into the composite set of patterned features that are transferable into the substrate by using the organic underlayer as a mask.

4. The method of claim 2, wherein remaining portions of the first silicon containing resist layer following developing thereof are patterned in a manner so as to remove at least one previously patterned feature within the silicon containing intermediate layer.

5. A method of patterning a semiconductor substrate, the method comprising:
    creating a first set of patterned features in a first inorganic layer;
    creating a second set of patterned features in one of the first inorganic layer and a second inorganic layer; and
    transferring, into an organic underlayer, both the first and second sets of patterned features, wherein the first and second sets of patterned features are combined into a composite set of patterned features that are transferable into the substrate by using the organic underlayer as a mask;
    wherein the second set of patterned features is also formed in the silicon containing intermediate layer following exposing a second organic resist layer formed over the first set of patterned features.

6. The method of claim 5, wherein the first and second exposures are implemented through dark field (DF) masks.

7. The method of claim 5, wherein the first exposure is implemented through a dark field (DF) mask and the second exposure is implemented through a bright field (BF) mask which blocks additional patterning of at least a portion of the first set of patterned features.

8. The method of claim 5, wherein the first exposure is implemented through a bright field (BF) mask and the second exposure is implemented through a dark field (DF) mask which blocks additional patterning of at least a portion of the first set of patterned features.

9. The method of claim 5, further comprising:
    exposing and developing a third organic resist layer formed over the first and second sets of patterned features so as to create a third set of patterned features in the silicon containing intermediate layer; and
    transferring each of the first, second and third sets of patterned features into the organic underlayer, wherein the first, second and third sets of patterned features are combined into the composite set of patterned features that are transferable into the substrate by using the organic underlayer as a mask.

10. A method of patterning a semiconductor substrate, the method comprising:
    creating a first set of patterned features in a first inorganic layer;
    creating a second set of patterned features in one of the first inorganic layer and a second inorganic layer; and
    transferring, into an organic underlayer, both the first and second sets of patterned features, wherein the first and second sets of patterned features are combined into a composite set of patterned features that are transferable into the substrate by using the organic underlayer as a mask;
    wherein the first inorganic layer comprises a first silicon containing resist layer; and
    the organic underlayer has anti-reflective properties.

11. The method of claim 10, further comprising:
    cross-linking the first set of patterned features formed in the first silicon containing resist layer; and
    exposing and developing a second silicon containing resist layer formed over the first sets of patterned features so as to create the second set of patterned features.

12. A method of enhancing photolithography resolution for patterning a semiconductor device, the method comprising:
    forming an organic underlayer on a semiconductor substrate;
    forming a silicon containing intermediate layer on the organic layer;
    forming a first organic resist layer on the intermediate layer;
    exposing and developing the first organic resist layer so as to form a first set of patterned features in the silicon containing intermediate layer;
    etching the intermediate layer so as to form a first pattern therein;

exposing and developing a second resist layer so as to form a second set of patterned features, wherein the first and second sets of patterned features define a composite set of patterned features; and etching the composite set of patterned features into the organic underlayer;

wherein the second resist layer comprises a first silicon containing resist layer formed over the first set of patterned features.

13. A method of enhancing photolithography resolution for patterning a semiconductor device, the method comprising:

forming an organic underlayer on a semiconductor substrate;

forming a silicon containing intermediate layer on the organic layer;

forming a first organic resist layer on the intermediate layer;

exposing and developing the first organic resist layer so as to form a first set of patterned features in the silicon containing intermediate layer;

etching the intermediate layer so as to form a first pattern therein;

exposing and developing a second resist layer so as to form a second set of patterned features, wherein the first and second sets of patterned features define a composite set of patterned features;

etching the composite set of patterned features into the organic underlayer;

cross-linking the second set of patterned features;

exposing and developing a second silicon containing resist layer formed over the first and second sets of patterned features so as to create a third set of patterned features; and etching each of the first, second and third sets of patterned features into the organic underlayer.

14. A method of enhancing photolithography resolution for patterning a semiconductor device, the method comprising:

forming an organic underlayer on a semiconductor substrate;

forming a silicon containing intermediate layer on the organic layer;

forming a first organic resist layer on the intermediate layer;

exposing and developing the first organic resist layer so as to form a first set of patterned features in the silicon containing intermediate layer;

etching the intermediate layer so as to form a first pattern therein;

exposing and developing a second resist layer so as to form a second set of patterned features, wherein the first and second sets of patterned features define a composite set of patterned features;

etching the composite set of patterned features into the organic underlayer, wherein the second resist layer comprises a second organic resist layer formed over the first set of patterned features, and wherein the second set of patterned features is formed in the silicon containing intermediate layer;

exposing and developing a third organic resist layer formed over the first and second sets of patterned features so as to create a third set of patterned features in the silicon containing intermediate layer; and etching each of the first, second and third sets of patterned features into the organic underlayer.

15. A method of enhancing photolithography resolution for patterning a semiconductor device, the method comprising:

forming an organic underlayer on a semiconductor substrate;

forming a first silicon containing resist layer on the organic layer;

exposing and developing the first silicon containing resist layer so as to form a first set of patterned features therein;

cross-linking the first set of patterned features;

forming a second silicon containing resist layer over the first set of patterned features;

exposing and developing the second silicon containing resist layer so as to form a second set of patterned features therein, wherein the first and second sets of patterned features define a composite set of patterned features; and etching the composite set of patterned features into the organic underlayer.

16. The method of claim 15, wherein the organic underlayer has anti-reflective properties.

* * * * *